United States Patent [19]
Zinman et al.

[11] Patent Number: 5,770,000
[45] Date of Patent: Jun. 23, 1998

[54] CLEANING SYSTEM AND METHOD

[75] Inventors: Iosef Zinman, Tel-Aviv; Alex Sergienko, Karmiel, both of Israel

[73] Assignee: Sizary Materials Purification Ltd., Migdal Tefen, Israel

[21] Appl. No.: 654,031

[22] Filed: May 28, 1996

[30] Foreign Application Priority Data

Jun. 11, 1995 [IL] Israel ........................................ 114097

[51] Int. Cl.⁶ .............................. B44C 1/22; H01L 21/00
[52] U.S. Cl. ........................... 156/345; 134/1.1; 134/1.2; 216/67; 216/37; 438/710; 438/694
[58] Field of Search ................................. 134/1, 1.1, 1.2, 134/1.3, 694; 438/710, 906; 216/67, 37; 156/345 P

[56] References Cited

U.S. PATENT DOCUMENTS 4,534,921  8/1985  Fierkens et al. .
5,410,122  4/1995  Su et al. ............................... 156/345 P

FOREIGN PATENT DOCUMENTS

A-0 414 038  2/1991  European Pat. Off. .
39 04969 A1  9/1989  Germany .
A-07 022 400  1/1995  Japan .

*Primary Examiner*—William Powell
*Attorney, Agent, or Firm*—Darby & Darby

[57] ABSTRACT

An improved cleaning system is provided for removing impurities from a material to be cleaned. The system includes two electrodes, a positive electrode ("anode") on one side, near to or in contact with the material to be cleaned, and a negative collector electrode ("cathode") located at a distance from the second side of the material. The material and the two electrodes are placed into a chamber. The system also includes a medium of conductivity which, when under voltage between anode and cathode, produces the flow of negative charge either as electrons or as negative ions. The chamber may be a vacuum chamber or a chamber filled with an inert gas or other electro-negative gases. The flow of negative charges provides layer of negative charge near the second surface of the material so as to induce the positive impurity ions to move towards the surface. Since a grid electrode is absent, the impure ions are removed unhindered from the material to be cleaned.

34 Claims, 7 Drawing Sheets

CLEANING SYSTEM AND METHOD

FIELD OF THE INVENTION

The present invention relates generally to systems and methods of removing chemical impurities from semiconductor, metallic and dielectric materials and, in particular, to such systems and methods which utilize electric fields.

BACKGROUND OF THE INVENTION

The microelectronic industry utilizes semiconductor, metallic and dielectric materials in quantity and requires that the materials be as free from impurities as possible. Therefore, numerous methods for removing chemical impurities from these materials have been proposed. All of the methods utilize the fact that most of the impurities are positive ions. Some methods utilize various negatively charged chemicals to pull the impurities out of the materials via chemical reactions. Others utilize electric fields to do so.

Figure 1:
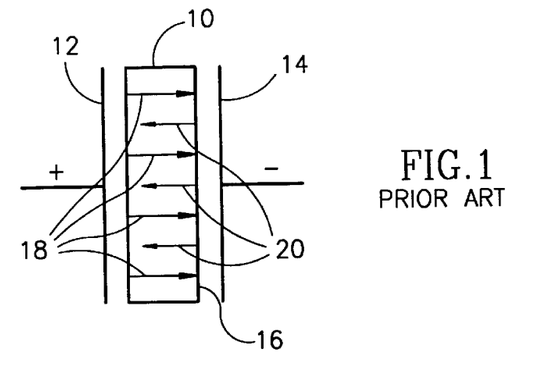
FIG. 1 is a schematic illustration of a first prior art cleaning system.

There are many systems which utilize electric fields, in all of which the material to be cleaned is placed between two electrodes connected to direct current (DC) voltage. This is illustrated in FIG. 1 to which reference is now made. The material to be cleaned is labeled 10, the positive electrode is labeled 12 and the negative electrode is labeled 14.

The material 10 is first heated to a temperature at which ions will move about the material. The potential difference between electrodes 12 and 14 induces the positive ions to move towards the surface, labeled 16, near the negative electrode 14. This is indicated by arrows 18. However, when the concentration of impure atoms near surface 16 is high, the impure atoms will diffuse back into the material, as indicated by arrows 20. Thus, the system of FIG. 1 does not achieve a high level of purity.

The system of FIG. 1 can be improved by gettering the impurities with chemically active materials, such as $Cl_2$, HCL, $J_2$, etc., and/or by chemical etching or polishing of surface 16. However, these additional steps complicate the cleaning process and increase production costs.

Figure 2:
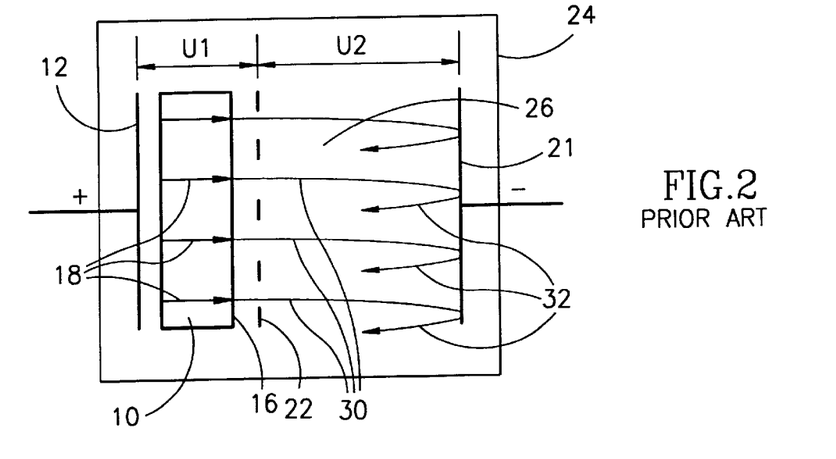
FIG. 2 is a schematic illustration of a second prior art cleaning system utilizing ion emission.

Reference is now made to FIG. 2 which illustrates a further prior art system, described in a patent application filed on Sep. 15, 1956, in Russia by one of the inventors of the present invention, in which ionic emission is utilized to remove the positive ions from the surface 16. In this system, a collector electrode 21 is placed at a distance from the material 10 and a second electrode 22, in the shape of a grid, is in contact with surface 16 of the material 10. Electrode 12 is also in contact with the material 10. The entire electrode-material apparatus is placed within a vacuum chamber 24 and heated to the appropriate temperature at which ion emission will occur. Since collector 21 is located at a distance from grid electrode 22, there is a vacuum gap 26 between the two electrodes.

A voltage potential U1 is applied between electrodes 12 and 22 in order to accelerate the positive ions toward the grid electrode 22, as indicated by arrows 18. A voltage potential U2 is applied between electrodes 22 and 21 thereby to accelerate the positive ions near grid 22 through the vacuum gap 26 towards collector electrode 21. The current, labeled 30, of ions through vacuum gap 26 is known as "ionic emission" and its extent is proportional to the concentration of impurities in the vicinity of grid electrode 22, which, in turn, is a function of the size of the voltage potential U1.

The higher the voltage potentials U1 and U2, the higher the current of ionic emission and the faster the positive ions "jump" towards collector 21. However, if the positive ions move too quickly, they will push out atoms of the collector 21 while being absorbed by it. This "cathode sputtering" is indicated by arrows 32. The pushed out atoms will diffuse back towards grid electrode 22 and the material 10 and thus, will be absorbed into material 10. Lower voltages can be utilized, but they induce fewer positive ions to leave the material 10.

The system of FIG. 2 has other drawbacks. The grid electrode 22 blocks a percentage (between 7 and 10%) of the surface 16 and thus, the surface 16 under grid electrode 22 is not cleaned. Grid electrode 22 is not effective for non-flat surfaces 16. Furthermore, for cleaning silicon wafers, two contacting electrodes cannot be utilized since it is impossible to avoid mechanical damage to the working side of a wafer.

SUMMARY OF THE PRESENT INVENTION

It is therefore an object of the present invention to provide an improved cleaning system for removing impurities from a material to be cleaned.

The system of the present invention includes two electrodes, a positive electrode ("anode") on one side, near to or in contact with the material to be cleaned, and a negative collector electrode ("cathode") located at a distance from the second side of the material. The material and the two electrodes are placed into a chamber. The system also includes a medium of conductivity which, when under voltage between anode and cathode, produces the flow of negative charge either as electrons or as negative ions. The chamber may be a vacuum chamber or a chamber filled with an inert gas or other electro-negative gases.

The flow of negative charges provides a layer of negative charge near the second surface of the material so as to induce the positive impurity ions to move towards the surface. Since a grid electrode is absent, the impure ions are removed unhindered from the material to be cleaned.

Furthermore, the layer of negative charge provides an electric field which is greater than that provided by the voltage not having this conductive medium. Thus, the present invention is able to remove more positive ions from the material, for the same voltage. Since the electric field is higher, the potential between the cleaned material and the collector electrode does not need to be as high. As a result of the lower potential, there is far less cathodic sputtering and less contamination of the material from collector impurities than in the prior art.

Furthermore, a heating system can be added to heat the material to be cleaned to encourage the positive ions within the material to move.

The medium of conductivity can be provided in a number of ways. In one embodiment, the collector is heated to a high enough temperature to also cause electrons to be emitted from the negative electrode towards the material to be cleaned. In a second embodiment, a filament is included within the gap which, when heated, emits electrons. In a third embodiment, a plasma is provided in the gap between the negative electrode and the material to be cleaned. Since the plasma has free electrons and ions, both negative and positive, it provides a flow of negative charge (from the negative electrode) towards the material to be cleaned.

The plasma may be formed from a gas by means of a high frequency inductor placed external to the chamber. The gas may be hydrogen, nitrogen, oxygen, an inert gas, other electro-negative gases or a mixture of any of these gases.

The gas may be ignited by a high voltage, high frequency transformer, such as Tesla transformer, or by means of at least a pair of igniter electrodes.

Furthermore, the cleaning system may include a third electrode placed at a distance from the first electrode, wherein the first and third electrodes are capable of defining an electrical potential therebetween and thereby, inducing ion emission from the material to be cleaned to the more negatively charged electrode.

The electrical potential may be produced by means of a transformer and a resistor may be connected between the transformer and the first electrode to avoid a short circuit through the plasma.

Furthermore, the material to be cleaned includes a material formed from semi-conductors, conductors and/or dielectric materials. The first electrode may be a plate, mesh, lattice or ring electrode.

Additionally, there is provided a cleaning system for removing impurities from a material to be cleaned in which the system includes two electrodes at a distance from a first surface of the material to be cleaned, defining gaps between each electrode and the material to be cleaned. The two electrodes are placed in a chamber and a medium of conductivity (such as a plasma) is produced within the gaps which provides a flow of negatively charged particles towards the more positive electrode. The system also includes at least one pair of igniter electrodes for igniting the gas to produce the plasma.

Additionally, there is provided a system for oxidizing a surface of a material which includes a first electrode placed near a first surface of the material. The system also includes a second electrode placed at a distance from a second surface of the material thereby defining a gap between the second electrode and the material. The second surface is the surface to be oxidized. The two electrodes and the material are placed in a chamber, which may be a vacuum chamber. A plasma of oxygen ions is produceable within the chamber and which, when under voltage between the two electrodes, produces a flow of oxygen ions towards the surface to be oxidized.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 3:
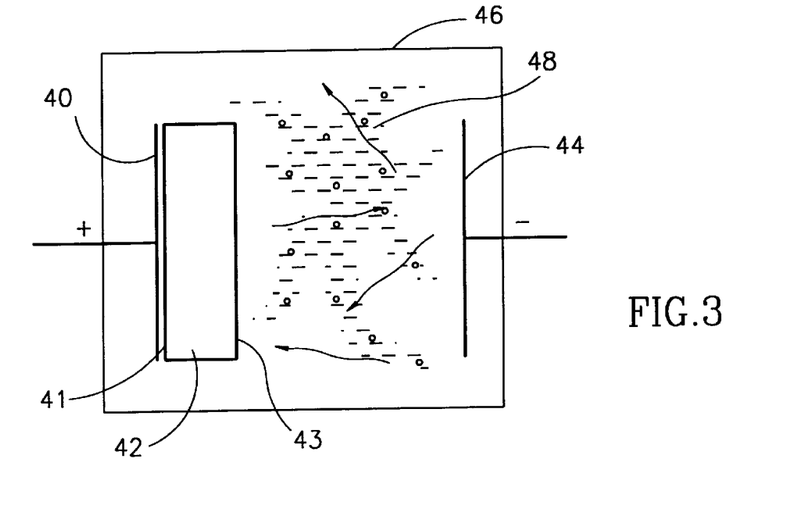
FIG. 3 is a schematic illustration of a "medium of conductivity" cleaning system, constructed and operative in accordance with a preferred embodiment of the present invention.
Figure 4:
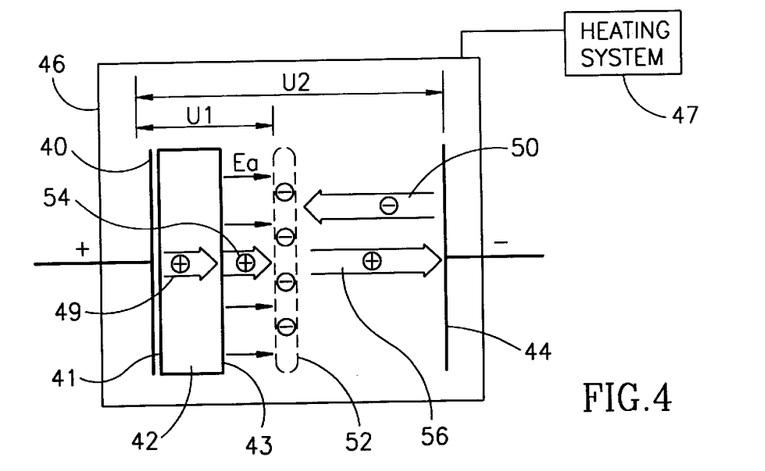
FIG. 4 is a schematic illustration useful in understanding the operation of the system of FIG. 3.

Reference is now made to FIG. 3 which illustrates a "medium of conductivity" cleaning system, constructed and operative in accordance with a preferred embodiment of the present invention, and to FIG. 4 which illustrates its operation.

The cleaning system of the present invention comprises a positive electrode (anode) 40 placed near to or in contact with one surface 41 of a material 42 to be cleaned, a negative collector electrode (cathode) 44 located at a distance from a second surface 43 of material 42, a chamber 46 in which the electrodes 40 and 44, and the material 42 are placed, a heating element 47 and a produceable medium 48 of conductivity. The medium of conductivity is produced during operations, and can be any source of negative charge and can be formed in any number of ways as detailed hereinbelow. The chamber may be a vacuum chamber or a chamber filled with an inert gas or an electro-negative gas.

In operation, the electrodes 40 and 44 and the material 42 are placed within the chamber 46. Medium 48 is produced therein and the entire chamber or electrode 40 and material 42 are heated up to a sufficient temperature to cause impurities within the material to begin to move (indicated by arrow 49) within the material. A typical temperature is 900°–1000° C.

A voltage potential U2, typically of 150–200 Volts, is provided between electrodes 40 and 44 which induces a flow 50 of negative charge towards the material 42 (which is positively charged due to its proximity to positive electrode 40). The negative charge accumulates in a layer 52 near the surface 43 and induce a flow 54 of the positive ions from out of the material 42. Since the collector electrode 44 is more negatively charged than the layer 52 of negative charge, the positive ions continue towards the collector electrode 44, as indicated by arrow 56.

The layer 52 acts as a separate electrode, providing an electric field across the material 42. Since layer 52 is uniform, the electric field is uniform and the cleaning of the material 42 is, thus, uniform. A combination of a voltage potential U2 of 150–200 Volts and using a medium of conductivity allows the ions to move relatively slowly towards the cathode. There is little cathodic sputtering. Thus, the cleaning of the material is carried out more efficiently.

Figure 5:
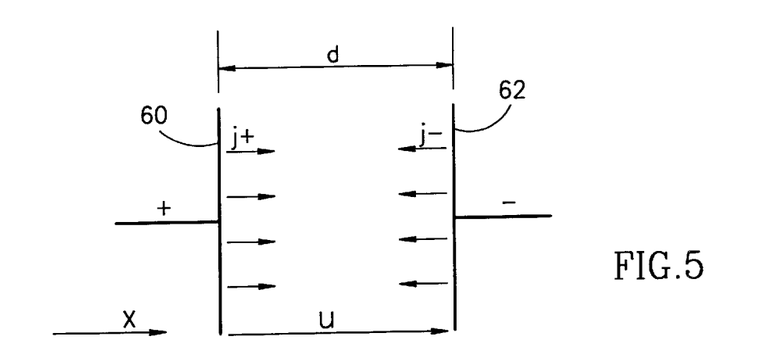
FIG. 5 is a schematic illustration of the calculation of the electric field in the system of FIG. 3.

The intensity of the electric field Ea is illustrated in FIG. 5 to which reference is now made. The electric field Ea at the surface of the positive electrode 60 is determined between two flat and parallel electrodes 60 and 62 where the positive electrode 60 emits positive ions with current density $j_+$ and the negative electrode 62 emits negatively charged electrons with current density $j_-$ in the opposite direction of the current density $j_+$. The equation of the electric field is:

$$\frac{d^2U}{dx^2} = -4\pi\rho \approx -4\pi \left( \frac{j_+}{v_+} - \frac{j_-}{v_-} \right) \quad (1)$$

where the following definitions hold:
U is the potential in the X plane;
U=O at x=O and U=Ua at x=d;
d is the distance between the two electrodes 60 and 62;
ρ is the total volume charge in the X plane;
$v_+$ is the velocity of positive charged ion of mass M after passing through the voltage potential (Ua−U); and
$v_-$ is the velocity of an electron of mass m and charge e after passing through the voltage potential U.

The first integral of equation 1 leads to the following expression for the value of the square of the intensity of the electric field, $Ea^2$ at the surface of the positive electrode 60:

$$Ea^2 = 8\sqrt{2}\ \pi \sqrt{\frac{m}{e}}\ j_- \left( 1 - \frac{j_+}{j_-} \sqrt{\frac{M}{m}} \right) \sqrt{Ua} \quad (2)$$

For the intensity of the electric field Ea to have real values the following condition must be fulfilled:

$$K = \frac{j_+}{j_-} \sqrt{M/m} < 1 \quad (3)$$

For common ratios of positive and negative currents $j_+$ and $j_-$ and for common ratios of masses M and m, the value of K is much less than 1. Therefore, equation 2 simplifies to:

$$Ea^2 = 8\pi j_- \sqrt{2m/e}\ \sqrt{Ua} \quad (4)$$

For the cleaning system of the present invention, the potential Ua, the current density $j_-$ and the distance d between the electrodes are bounded by Langmuir's equation:

$$j_- = \frac{1}{9\pi} \sqrt{\frac{2e}{m}}\ \frac{Ua^{\frac{3}{2}}}{d^2} \quad (5)$$

By substituting equation 5 into equation 4, the following simple relationship is obtained:

$$Ea = \frac{4}{3}\ \frac{Ua}{d} = \frac{4}{3}\ Eo\ \text{volts/cm} \quad (6)$$

where Eo is the intensity of the field when there is no flow of negative charge.

Equation 6 indicates that the flow 50 of electrons strengthens the intensity of the electric field at the surface of the positive electrode 60 by a factor of 1.33. The addition of the flow 50 of electrons, therefore, reduces the potential of the collector 44 needed to remove a given amount of impurities by a factor of 1.33. With the lower potential, the speed of the positive ions is lower and thus, there is much less cathodic sputtering.

The medium 48 of conductivity can be produced in a number of ways. In a first embodiment, electrode 44 is heated to a sufficiently high temperature, such as 1400° C. for tantalum. The high temperature causes electrons to be emitted which are then attracted to the material 42 which has a positive charge. The emitted electrons then produce layer 52 which induces an electric field over the material 42.

Figure 6:
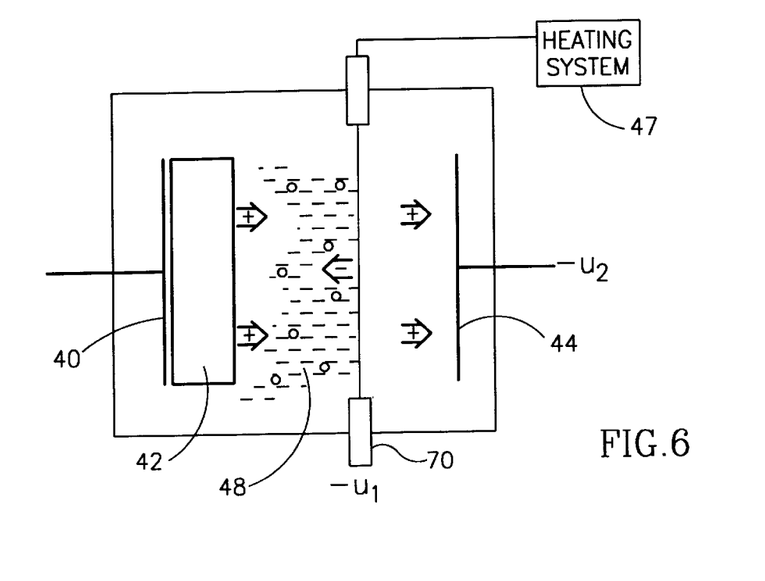
FIG. 6 is a schematic illustration of one embodiment of the cleaning system of FIG. 3 utilizing a filament to create the medium of conductivity.

In a second embodiment, shown in FIG. 6 to which reference is briefly made, a filament 70 is added to the cleaning system. Heated filament 70 is negatively charged relative to electrode 40. The remaining elements are the same and thus, similar elements have similar reference numerals.

The filament 70 is heated to a suitable temperature, and in a manner similar to the method described with respect to the heating of electrode 44, filament 70 emits electrons which are then attracted to the material 42.

Figure 7:
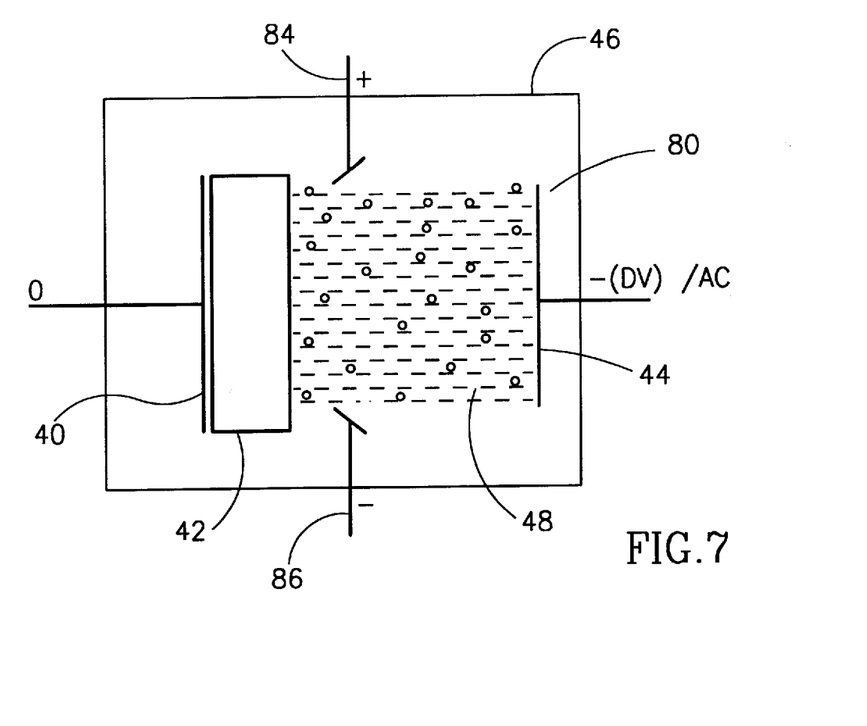
FIG. 7 is a schematic illustration of a second embodiment of the cleaning system of FIG. 3 utilizing a plasma to create the medium of conductivity.
Figure 8:
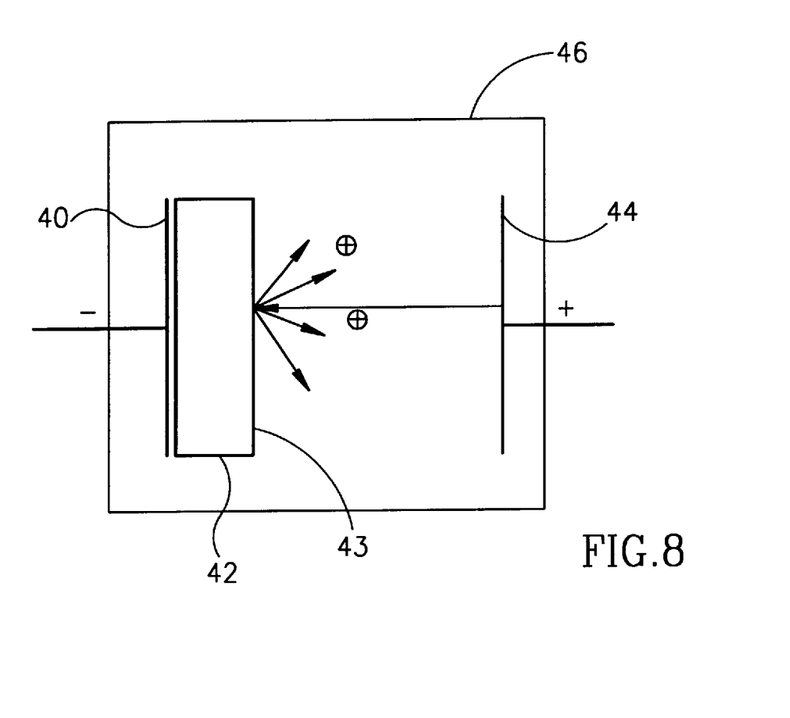
FIG. 8 is a schematic illustration useful in understanding the embodiment of FIG. 7.

Reference is now made to FIG. 7 which illustrates a third embodiment of the present invention in which the medium 48 is an electronic-ionic plasma and to FIG. 8 which illustrates some aspects of how the cleaning system of FIG. 7 operates. Similar reference numerals refer to similar elements.

In this embodiment, the cleaning system comprises the positive and negative electrodes 40 and 44 within the vacuum chamber 46, an inert gas 80, such as, but not limited to, argon, other inert gases, or other such gases such as oxygen, nitrogen and hydrogen or their mixtures. The gas 80 is introduced into chamber 46 until a pressure of at least $1 \times 10^{-4}$ Torr. is achieved. A sufficiently high voltage (AC or DC) is supplied to "ignite" the gas 80 and maintain a discharge of electron/ion plasma.

Thereafter, the starter (typically formed of two electrodes 84 and 86 between which is a potential) is activated and the gas is converted into a plasma 48.

The plasma 48 has therein negatively charged particles, such as electrons and negative ions, and positively charged particles, such as ions. When the material 42 to be cleaned is positively charged (due to its proximity to the positive electrode 40), the negatively charged particles flow towards the material 42, thereby creating layer 52 of FIG. 4. At the same time, there is an "anodic fall" of potential ΔUa at the surface 43 of the material 42 which accelerates the positive impurity ions towards the negatively charged collector electrode 44.

The magnitude of the anodic fall depends at least upon the nature of the plasma gas used, the density of the current $j_-$ of electrons, and the relationship between the surface area of the electrode 42 and a cross-section of the plasma. For instance, it is known that the value of ΔUa monotically grows as the density of current $j_-$ grows. For inert gases, the anodic fall is close to the value of the ionization potential of the gas and the value of intensity of the field at the surface of the material U3 can be determined from equation 4.

In this embodiment, the electrodes 40 and 44 can either be connected to DC current or to alternating current (AC). In the latter case, the cleaning system operates as described hereinabove only when collector electrode 44 is negative with respect to electrode 40. When electrode 40 is the more negative electrode, as indicated in FIG. 8, the positive ions of the plasma flow towards the material 42. The positive ions are accelerated by a cathodic fall (opposite of the anodic fall) near the surface 43. Thus, the ions approach the surface 43 of material 42 at a high speed and bombard the surface 43, pushing impure atoms from the surface 43 out of the material.

If all or part of the gas 80 is electrically negative, such as is the case for oxygen, the medium 48 is a "medium of negative ions" and the anodic fall is due to the negative ions in the plasma 48, rather than due to the electrons as described previously. Therefore, the mass m of the electron in equations 4 and 5 should be replaced with the mass $M_{ion}$ of one negative ion, such as $O^-$. If the gas 80 is entirely oxygen, this change causes an increase in the value of the intensity Ea of the electric field by a factor of 30.

It is noted that the oxygen ions will combine with free radicals on the surface of the material 42 to be cleaned in a process known as "oxidation". Because the oxygen ions are accelerated in the region of the anodic fall, the oxidation is much deeper and takes less time than standard oxidation techniques. In this case, non-oxidizing electrodes, such as silicon carbide, are used. Thus, the present invention can be utilized to oxidize a surface at the same time, or instead of, cleaning the material 42. As in standard oxidation techniques, if it was desired to only oxidize a portion of the surface, a photoresist could be utilized to cover those portions of the surface which should not be oxidized.

Figure 9:
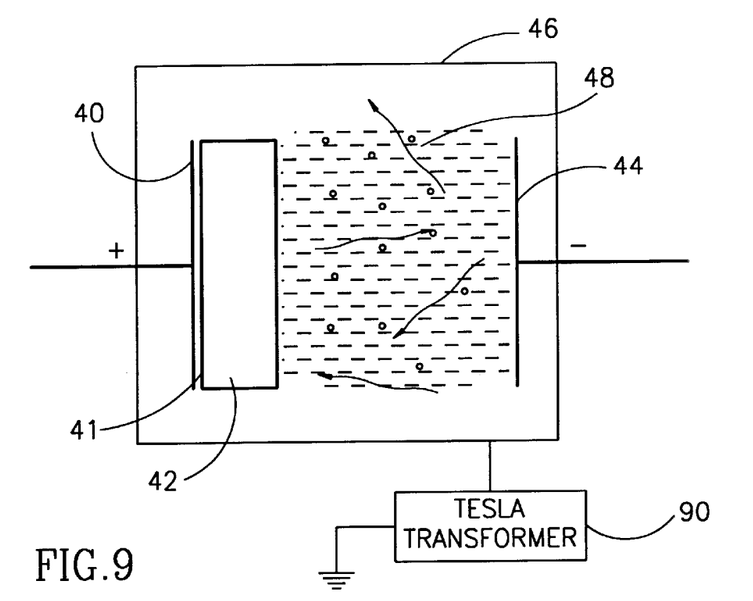
FIG. 9 is a schematic illustration of a further embodiment of the cleaning system of FIG. 3 utilizing a transformer to ignite a gas into plasma.

The gas discharge can be "ignited" in a number of ways. For example, in an embodiment shown in FIG. 9, a high voltage/high frequency transformer 90, such as a "Tesla" transformer, can be used to give an initial high voltage boost to ignite gas 80. Once ignition has taken place, sufficient voltage is supplied between the two electrodes 40 and 44 to maintain the flow of negative charge towards material 42.

Figure 10:
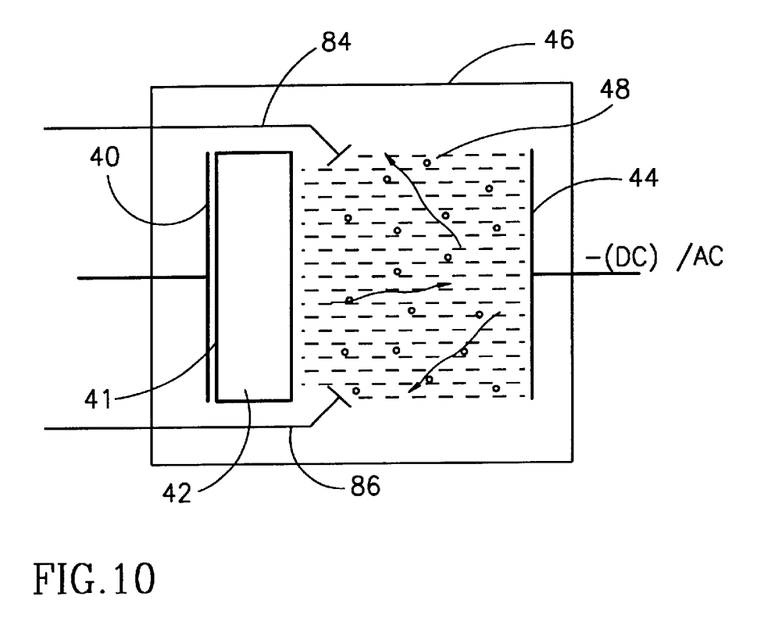
FIG. 10 is a schematic illustration of a further embodiment of the cleaning system of FIG. 3 utilizing a pair of electrodes to ignite the gas.

Reference is now made to FIG. 10 which illustrates a further embodiment of the present invention in which two additional electrodes 84 and 86 are used to provide gas ignition. Electrodes 84 and 86 are located between material 42 and collector 44, close to material 42. A direct or indirect current is provided to supply the electrical voltage needed to ignite the gas. Placing additional electrodes 84 and 86 close to material 42 on the collector side of material 42 ensures that the gas discharge covers material 42 uniformly. Additional electrodes 84 and 86 can be angled, as shown, in order to prevent any sputtering from being reflected back to material 42.

Figure 11:
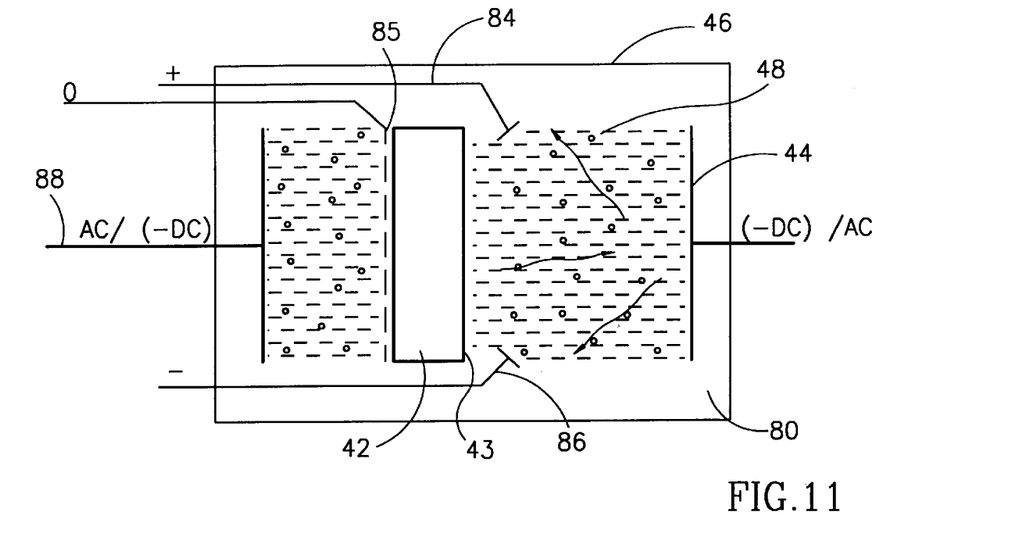
FIG. 11 is a schematic illustration of a further embodiment of the cleaning system of FIG. 3 utilizing an additional collector electrode.
Figure 12:
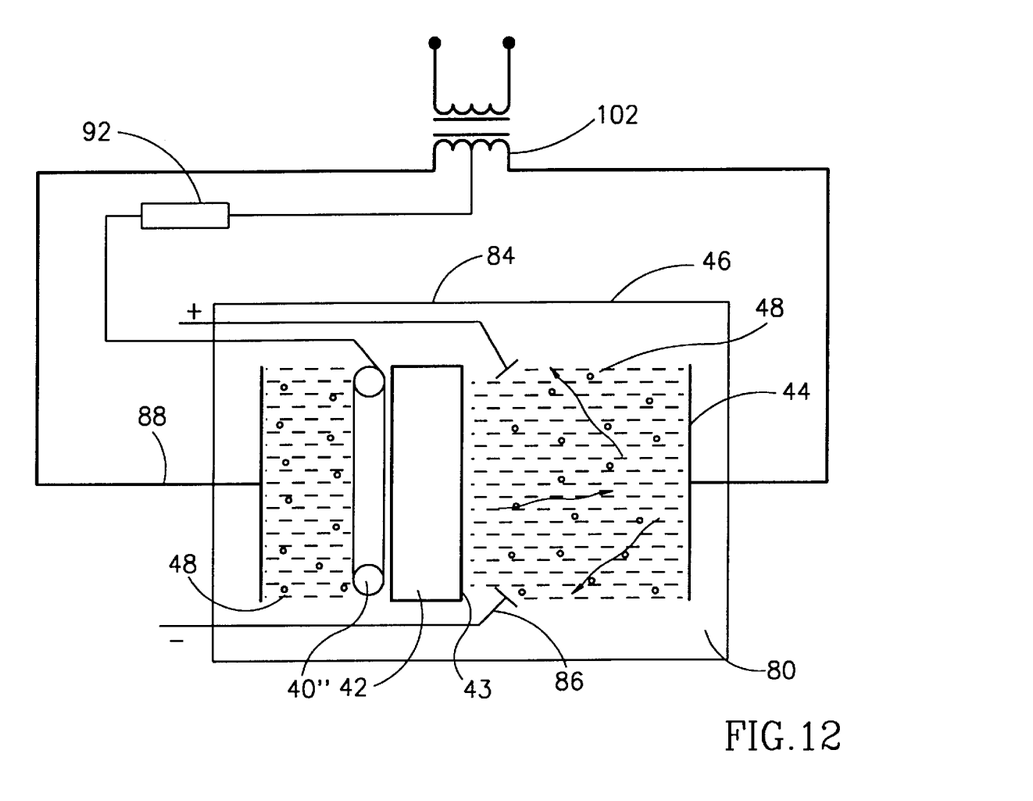
FIG. 12 is a schematic illustration of the embodiment of FIG. 11 utilizing a transformer to ignite a gas into plasma.

Reference is now made to FIGS. 11 and 12 which illustrate a further embodiment of the present invention in which a second collector electrode 88 is added. Second collector electrode 88 is placed at a distance from positive electrode 40 on the opposite side of negative electrode 44. The positive electrode, which is placed in contact with material 42, can be made from mesh or lattice material 40' (FIG. 11) or can comprise a ring electrode 40" (FIG. 12). The use of two negative collectors, one on each side of material 42, increases the action of dislodging impure atoms, as described hereinabove with respect to FIG. 4, and occurs on both sides of material 42. An open mesh, lattice or ring electrode allows the ions to move more freely.

FIG. 12 further illustrates a transformer 102 connected to electrodes 44 and 88. Transformer 102 is also connected, via a resistor 92, to electrode 40 adjacent to material 42. Resistor 92 reduces the voltage to electrode 40 so that a short circuit does not occur between the positive electrode 40 and the negative electrode 88 through the plasma.

Figure 13:
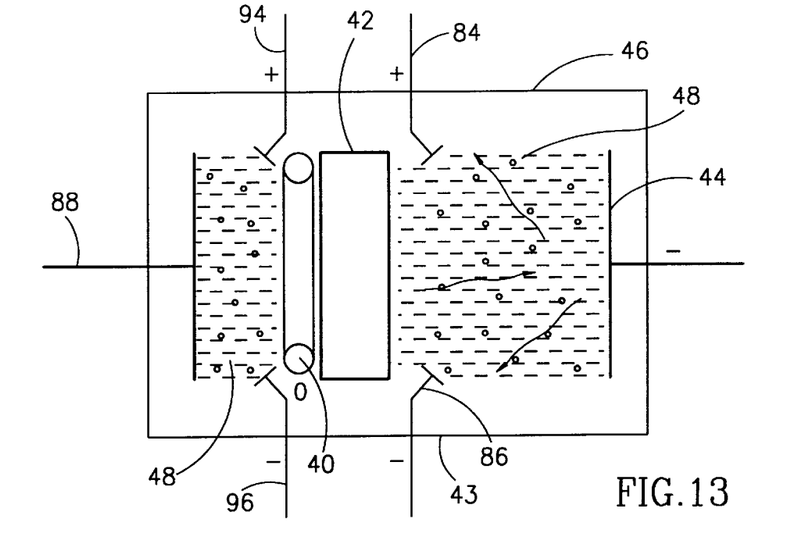
FIG. 13 is a schematic illustration of a further embodiment of the cleaning system of FIG. 11 utilizing a pair of electrodes to ignite the gas.

Reference is now made to FIG. 13 which illustrates a further embodiment of the present invention in which a second pair of additional electrodes 94 and 96 are inserted between electrode 40, adjacent material 42, and second collector 88. Additional electrodes 94 and 96 are used to ignite gas 80 similar to additional electrodes 84 and 86, as described hereinabove with reference to FIG. 10. The use of two pairs of additional electrodes, 84 and 86, and 94 and 96, respectively, ensures a more uniform ignition on each side of material 42.

Figure 14:
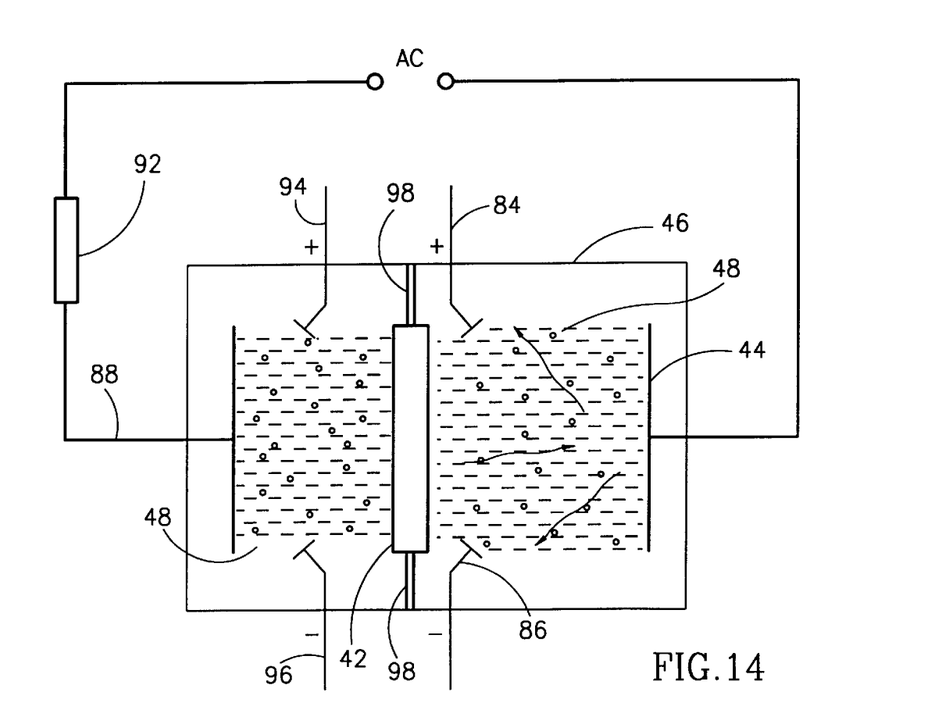
FIG. 14 is a schematic illustration of a further embodiment of the cleaning system of FIG. 3 utilizing the ignited gas to provide an electrical circuit.

Reference is now made to FIG. 14 which illustrates a further embodiment of the present invention in which the electrical contact between the opposite surfaces of material 42 is established by the ignited gas 80 without the necessity of using electrode 40. In this case, material 42 is insulated from vacuum chamber 46 by means of insulators 98. On either side of material 42, a pair of additional electrodes, 84 and 86, and 94 and 96, respectively, are located to provide uniform ignition, as described hereinabove with reference to FIG. 10. Indirect voltage is supplied to collector electrodes 44 and 88.

Figure 15:
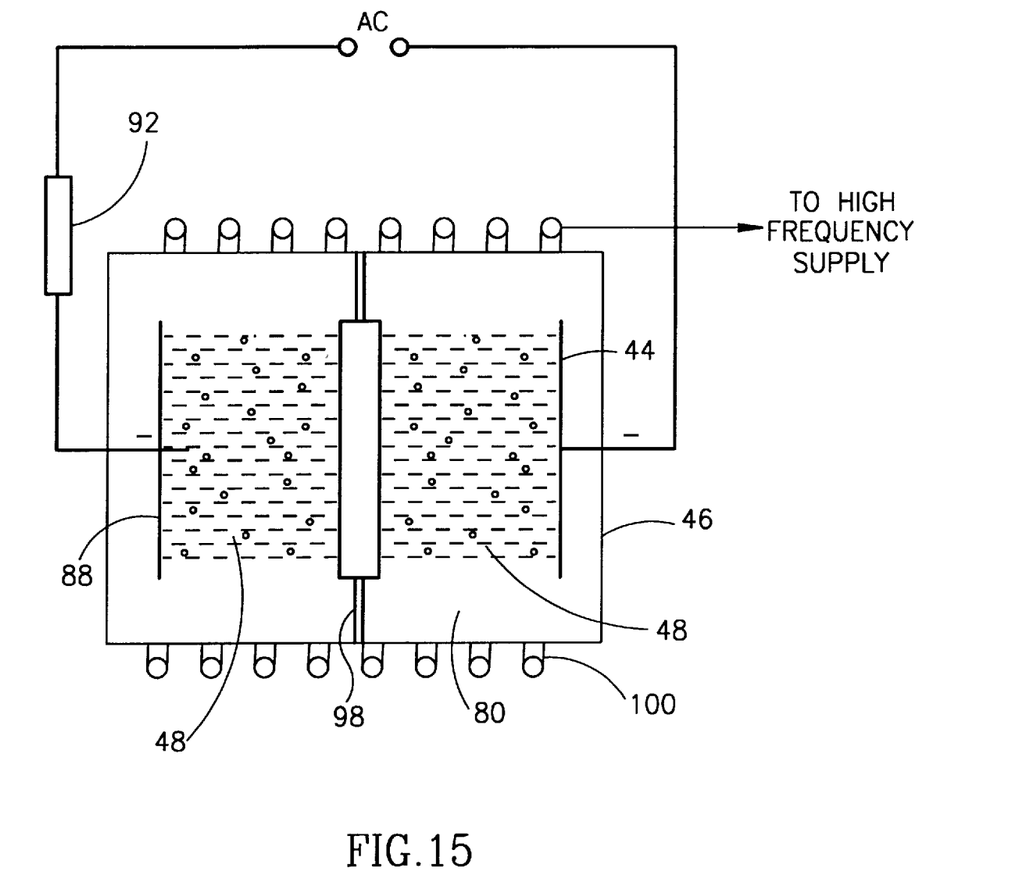
FIG. 15 is a schematic illustration of one embodiment of the cleaning system of FIG. 3 utilizing a high frequency inductor to create the medium of conductivity.

Reference is now made to FIG. 15 which illustrates a yet further embodiment of the present invention in which conductive medium 48 is produced by means of a high frequency inductor 100 placed external to chamber 46.

It will be appreciated by persons skilled in the art that the present invention is not limited to what has been particularly shown and described hereinabove. Rather the scope of the present invention is defined by the claims which follow:

We claim:

1. A cleaning system for removing impurities from a material to be cleaned, the system comprising:
    a. a first electrode placed near to a first surface of said material to be cleaned;
    b. a second electrode placed at a distance from a second surface of said material to be cleaned thereby defining a gap between said second electrode and said material to be cleaned;
    c. a chamber into which said first and second electrodes and said material to be cleaned is placed;
    d. a medium of conductivity produceable at least within said gap, wherein said first and second electrodes are capable of defining an electrical potential therebetween and inducing, thereby, ion emission from said material to be cleaned to the more negatively charged electrode, and wherein, when said electrical potential exists, said medium of conductivity provides at least a flow of negatively charged particles towards the more positive electrode.

2. A cleaning system according to claim 1 wherein said chamber is a vacuum chamber.

3. A cleaning system according to claim 1 wherein said chamber is filled with a gas wherein said gas is one of the following group: hydrogen, nitrogen, oxygen, an inert gas, an electro-negative gas and a mixture of any of these gases.

4. A cleaning system according to claim 1 further comprising a heating system for heating at least said material to be cleaned.

5. A cleaning system according to claim 1 and wherein said first electrode is in contact with a first surface of said material to be cleaned.

6. A cleaning system according to claim 1 and wherein said first and second electrode are connected to direct current.

7. A cleaning system according to claim 1 and wherein said first and second electrode are connected to alternating current.

8. A cleaning system according to claim 1 wherein said medium of conductivity is electrons emitted when said second electrode is heated to provide thermoelectric emission.

9. A cleaning system according to claim 1 and also comprising a filament, wherein said medium of conductivity is electrons emitted from said filament when said filament is heated to provide thermoelectric emission.

10. A cleaning system according to claim 1 wherein said medium of conductivity is a plasma formed from a gas.

11. A cleaning system according to claim 1 wherein said medium of conductivity is a plasma formed by means of a high frequency inductor placed external to said chamber.

12. A cleaning system according to claim 10 and wherein said gas is one of the following group: hydrogen, nitrogen, oxygen, an inert gas, an electro-negative gas and a mixture of any of these gases.

13. A cleaning system according to claim 10 and also comprising a high voltage, high frequency transformer for igniting the gas to produce said plasma.

14. A cleaning system according to claim 13 wherein said transformer is a Tesla transformer.

15. A cleaning system according to claim 10 and also comprising at least a pair of igniter electrodes, for igniting the gas to produce said plasma.

16. A cleaning system according to claim 12 and also comprising at least a pair of igniter electrodes, for igniting the gas to produce said plasma.

17. A cleaning system according to claim 1 and wherein said medium of conductivity produces, in the presence of a voltage potential drop from said first electrode to said second electrode, a negatively charged layer near the second surface of said material to be cleaned thereby producing a potential drop from said first electrode to said negatively charged layer.

18. A cleaning system according to claim 1 and further comprising a third electrode placed at a distance from said first electrode, wherein said first and third electrodes are capable of defining an electrical potential therebetween and inducing, thereby, ion emission from said material to be cleaned to the more negatively charged electrode.

19. A cleaning system according to claim 17 and wherein said electrical potential is produced by means of a transformer.

20. A cleaning system according to claim 18 and wherein said electrical potential is produced by means of a transformer.

21. A cleaning system according to claim 17 and wherein a resistor is connected between said transformer and said first electrode for limiting the flow of electrically charged particles to said first electrode.

22. A cleaning system according to claim 1 and wherein said material to be cleaned is a formed of one of the following group of materials: semiconductors, conductors and dielectric materials.

23. A cleaning system according to claim 1 and wherein said first electrode is one of the following group of electrodes: plate, mesh, lattice or ring electrodes.

24. A cleaning system for removing impurities from a material to be cleaned, the system comprising:

a. a first electrode at a distance from a first surface of said material to be cleaned thereby defining a first gap between said first electrode and said material to be cleaned;

b. a second electrode placed at a distance from a second surface of said material to be cleaned thereby defining a second gap between said second electrode and said material to be cleaned;

c. a chamber into which said first and second electrodes and said material to be cleaned is placed;

d. a medium of conductivity produceable at least within said gaps;

e. at least one pair of igniter electrodes for igniting the gas to produce said plasma, wherein said first and second electrodes are capable of defining an electrical potential therebetween and inducing, thereby, ion emission from said material to be cleaned to the more negatively charged electrode, and wherein, when said electrical potential is produced by alternating current, said medium of conductivity provides at least a flow of negatively charged particles towards the more positive electrode.

25. A cleaning system according to claim 24 further comprising a heating system for heating at least said material to be cleaned.

26. A system for cleaning and simultaneously oxidizing a surface of a material, the system comprising:

a. a first electrode placed near a first surface of said material;

b. a second electrode placed at a distance from a second surface of said material thereby defining a gap between said second electrode and said material, said second surface being the surface to be oxidized;

c. a chamber into which said first and second electrodes and said material is placed; and d. a plasma of at least oxygen ions therein and produceable within said chamber, wherein said first and second electrodes are capable of defining an electrical potential therebetween, wherein, when said electrical potential exists, said plasma provides a flow of at least oxygen ions towards said second surface.

27. A cleaning system according to claim 26 and wherein said first electrode is in contact with a first surface of said material to be cleaned.

28. A system according to claim 26 wherein said first and second electrodes are non-oxidizable electrodes.

29. A system according to claim 26 wherein said chamber is a vacuum chamber.

30. A system according to claim 26 wherein said chamber is filled with a gas wherein said gas is one of the following group: hydrogen, nitrogen, oxygen, an inert gas, an electronegative gas and a mixture of any of these gases.

31. A cleaning system according to claim 1 and wherein said material to be cleaned is formed of semiconductors and conductors.

32. A cleaning system according to claim 1 and wherein said material to be cleaned is formed of conductors and dialectric material.

33. A cleaning system according to claim 1 and wherein said material to be cleaned is formed of semiconductors and dialectric material.

34. A cleaning system according to claim 1 and wherein said material to be cleaned is formed of semiconductors, conductors and dialectric material.

* * * * *